US012604583B2

(12) United States Patent
Mezouari et al.

(10) Patent No.: US 12,604,583 B2
(45) Date of Patent: Apr. 14, 2026

(54) HYBRID MICRODISPLAY

(71) Applicant: PLESSEY SEMICONDUCTORS LTD, Plymouth (GB)

(72) Inventors: Samir Mezouari, Plymouth (GB); Andrea Pinos, Plymouth (GB); WeiSin Tan, Plymouth (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 443 days.

(21) Appl. No.: 17/924,846

(22) PCT Filed: Jun. 22, 2021

(86) PCT No.: PCT/GB2021/051573
§ 371 (c)(1),
(2) Date: Nov. 11, 2022

(87) PCT Pub. No.: WO2022/003323
PCT Pub. Date: Jan. 6, 2022

(65) Prior Publication Data
US 2023/0187592 A1    Jun. 15, 2023

(30) Foreign Application Priority Data
Jun. 29, 2020    (GB) ..................................... 2009890

(51) Int. Cl.
*H01L 33/62*       (2010.01)
*H01L 25/075*      (2006.01)
*H10H 20/01*       (2025.01)
*H10H 20/857*      (2025.01)

(52) U.S. Cl.
CPC ....... *H10H 20/857* (2025.01); *H01L 25/0753* (2013.01); *H10H 20/0137* (2025.01); *H10H 20/0364* (2025.01)

(58) Field of Classification Search
CPC ............. H10H 20/857; H10H 20/0137; H10H 20/0364; H10H 20/833; H10H 20/835;
(Continued)

(56) References Cited

U.S. PATENT DOCUMENTS

2016/0141469 A1    5/2016    Robin et al.
2018/0114878 A1    4/2018    Danesh et al.
(Continued)

FOREIGN PATENT DOCUMENTS

CN      101005110 A      7/2007
CN      110462850 A      11/2019
(Continued)

OTHER PUBLICATIONS

International Search Report and Written Opinion in PCT International Application No. PCT/GB2021/051573 mailed Sep. 28, 2021.
(Continued)

*Primary Examiner* — Cuong B Nguyen
(74) *Attorney, Agent, or Firm* — Cognition IP, P.C.; Edward Steakley

(57) ABSTRACT

A method of forming a display comprising: bonding a backplane comprising a plurality of backplane electrical contacts to a monolithic light emitting diode structure comprising a corresponding plurality of electrical contacts, wherein bonding comprises forming a reversible bond between at least one of the plurality of backplane electrical contacts and a corresponding electrical contact of the monolithic light emitting diode structure; and removing material from the monolithic light emitting diode structure to provide a plurality of physically isolated light emitting diode dies, thereby to enable removal and/or replacement of at least one physically isolated light emitting diode die by reversing the reversible bond between the at least one of the plurality of
(Continued)

backplane electrical contacts and the corresponding electrical contact of the monolithic light emitting diode structure.

13 Claims, 5 Drawing Sheets

(58) Field of Classification Search
CPC .... H10H 29/142; H10H 20/018; H10H 20/84; H10H 20/01; H10H 20/81; H01L 25/0753; H01L 25/50; H01L 2224/80894–80896; H01L 21/187
See application file for complete search history.

(56) References Cited

U.S. PATENT DOCUMENTS

| | | | |
|---|---|---|---|
| 2019/0385513 A1 | 12/2019 | Katsuji et al. | |
| 2019/0393069 A1 | 12/2019 | Paranjpe et al. | |
| 2021/0020688 A1* | 1/2021 | Templier | H10H 29/142 |

FOREIGN PATENT DOCUMENTS

| | | | |
|---|---|---|---|
| JP | 2016178307 | A | 10/2016 |
| JP | 2020-86154 | A | 11/2021 |
| KR | 20130092896 | A | 8/2013 |
| TW | I598287 | B | 9/2017 |
| TW | 201919257 | A | 5/2019 |
| WO | 2016188505 | A1 | 12/2016 |
| WO | 2019173986 | A1 | 9/2019 |

OTHER PUBLICATIONS

International Preliminary Report on Patentability in PCT International Application No. PCT/GB2021/051573 mailed Dec. 13, 2022.
Office Action received in counterpart Chinese patent application No. 202180045289.7, mailed on Feb. 5, 2026.

* cited by examiner

HYBRID MICRODISPLAY

CROSS-REFERENCE TO RELATED APPLICATIONS

This application is a 35 U.S.C. § 371 national stage application of PCT International Application No. PCT/GB2021/051573, filed on Jun. 21, 2021, which claims the benefit of Great Britain Application No. 2009890.1 filed Jun. 29, 2020, which are hereby incorporated by reference in their entirety.

FIELD OF THE INVENTION

The invention relates to the formation of a display. In particular, but not exclusively, the invention relates to a monolithic-based micro light emitting diode (LED) display and a method of forming a monolithic-based micro LED display with the facility to replace pixels.

BACKGROUND OF THE INVENTION

Light emitting diode (LED) devices are known to provide highly efficient and controllable light sources for display applications. Advantageously, the implementation of LED devices into micro LED arrays with small pixels at an ultra-fine pitch enables the production of high resolution displays. However, the presence of any defective LED devices in such arrays can be problematic. Typically, the number of dead pixels (e.g., defective LED devices in a micro LED array) is preferably less than 2 dead pixels per 2 million pixels (i.e., a successful yield of 99.9999%) in order to provide an acceptable display.

Such high yields can be difficult to achieve using known processes. In order to mitigate for the presence of defective pixels in LED devices, redundancy schemes are known to be implemented, where back-up devices are provided in an LED array in order to provide light to pixels where there is a failure of any device. However, such redundancy schemes use additional space, which affects the provision of closely packed, small, LED devices (dies) and hence pixels in micro LED displays.

Whilst the monolithic growth of arrays of devices beneficially enables the provision of micro LED arrays with an ultra-fine pitch, repair of any defective LED devices is difficult, as the defective devices form part of an integrated structure. Accordingly, realising monolithically formed ultra-fine micro LED arrays with a sufficiently successful yield of pixels is challenging.

SUMMARY OF THE INVENTION

In order to mitigate at least some of the above-described problems, there is provided a method of forming a display comprising: bonding a backplane comprising a plurality of backplane electrical contacts to a monolithic light emitting diode structure comprising a corresponding plurality of electrical contacts, wherein bonding comprises forming a reversible bond between at least one of the plurality of backplane electrical contacts and a corresponding electrical contact of the monolithic light emitting diode structure; and removing material from the monolithic light emitting diode structure to provide a plurality of physically isolated light emitting diode dies, thereby to enable removal and/or replacement of at least one physically isolated light emitting diode die by reversing the reversible bond between the at least one of the plurality of backplane electrical contacts and the corresponding electrical contact of the monolithic light emitting diode structure.

There is also provided a display comprising: a backplane comprising a plurality of backplane electrical contacts bonded to a plurality of physically isolated light emitting diode dies having an electrical contact, wherein at least one of the plurality of backplane electrical contacts is bonded to a corresponding electrical contact of the plurality of physically isolated light emitting diode dies using a reversible bond, thereby to enable removal and/or replacement of at least one physically isolated light emitting diode die by reversing the reversible bond between the at least one backplane electrical contact and the corresponding electrical contact of the plurality of physically isolated light emitting diode dies, wherein the plurality of physically isolated light emitting diode dies are formed from a monolithic light emitting diode structure.

Advantageously, the formation of a display by bonding a backplane to a monolithic light emitting diode structure, removing material and forming reversible bonds between at least one of a plurality of backplane electrical contacts and the corresponding electrical contact of the monolithic light emitting diode structure means that individual LED dies can be identified and replaced, thereby ensuring that a sufficiently high yield of functional devices is present in a display without requiring space to be used for redundancy. Beneficially, arrays of light emitting pixels can be provided in a high resolution display with the facility to replace individual light emitting diode device dies, where required.

Preferably, the at least one of the backplane electrical contacts is reversibly bonded to the corresponding electrical contact of the monolithic light emitting diode structure using metal-to-metal bonding and/or eutectic bonding. Advantageously, such bonding facilitates removal and replacement of LED devices whilst providing the electrical conductivity to form functioning devices and whilst providing a reflective surface to aid light extraction from individual LED devices.

Preferably, the method comprises: removing at least one physically isolated light emitting diode die; and replacing the at least one physically isolated light emitting diode die with a different one or more light emitting diode dies. Advantageously, the display is adapted to provide light emission from individual light emitting devices in an array with a preferred arrangement of light emission properties.

Preferably, the method comprises: removing at least one physically isolated light emitting diode die comprises increasing the temperature of the display thereby to enable removal of the at least one physically isolated light emitting diode die at the reversible bond between the backplane electrical contact and the corresponding electrical contact associated with the monolithic light emitting diode structure, preferably wherein increasing the temperature of the display comprises increasing the temperature at the reversible bond to surpass a eutectic temperature of the reversible bond, preferably wherein the reversible bond comprises at least one of a AuSn eutectic bond, a CuSn eutectic bond and a InSn eutectic bond. Advantageously, a controllable method is presented that simultaneously enables electrical conductivity, reversible bonding and relatively high reflectivity for enhanced light extraction.

Preferably, removing at least one physically isolated light emitting diode die comprises overcoming an electrostatic force of the reversible bond, preferably wherein the electrostatic force of the reversible bond is the electrostatic force of at least one of a Au—Au metal bond and a Cu—Cu metal bond. Advantageously, metal-metal bonds can be provided that simultaneously enable electrical conductivity, reversible bonding and relatively high reflectivity for enhanced light extraction.

Preferably, the method comprises: testing at least one of the plurality of physically isolated light emitting diode dies; identifying one or more defective light emitting diode dies; removing defective light emitting diode dies; and replacing the one or more removed light emitting diode dies. Advantageously, displays with high yields of working devices are provided based on monolithically grown LED devices, thereby providing high resolution displays.

Preferably, the method comprises: forming a conformal metal layer on at least a portion of the physically isolated light emitting diode dies, thereby to reduce optical cross talk between physically isolated light emitting diode dies. Advantageously, light extraction from individual LED dies is enhanced and the contrast between pixels associated with LED dies is improved.

Preferably, the method comprises: forming a transparent electrically conductive layer on the plurality of isolated light emitting diode dies, thereby to provide a common electrode. Advantageously, multiple devices in an array are simultaneously contacted thereby efficiently processing large numbers of devices.

Preferably, the method comprises: forming one or more magnetic metal regions associated with at least one of the physically isolated light emitting diode dies, thereby to facilitate removal of physically isolated light emitting diode dies. Advantageously, removal of individually dies is enhanced by the use of magnetic materials, thereby overcoming any residual forces to aid removal of individual LED devices.

Preferably, at least one of the reversible bonds is at least partially laterally surrounded by a dielectric layer thereby to separate the backplane and the monolithic light emitting diode structure, preferably wherein the dielectric layer comprises at least one of $SiO_2$, $Si_3N_4$, Su-8, $SrF_2$, PDMS and PMMA. Advantageously, the dielectric layer enables uniform processing without preventing removal of individual LED dies.

Preferably, the plurality of contacts of the monolithic light emitting structure comprises a high reflectivity metal, preferably wherein the high reflectivity metal is one of nickel (Ni) and silver (Ag). Advantageously, such metal simultaneously provides electric conductivity whilst aiding light extraction.

Preferably, removing material from the monolithic light emitting diode structure comprises forming a discontinuity in at least one layer of the monolithic light emitting diode structure, preferably wherein the at least one layer of the monolithic light emitting diode structure is an n-type layer, more preferably wherein the n-type layer is an n-doped gallium nitride layer. Advantageously, forming discontinuities enables removal and replacement of individual, physically isolated dies.

Further aspects of the invention will be apparent from the description and the appended claims.

Detailed description of an embodiment of the invention

A detailed description of embodiments of the invention is described, by way of example only, with reference to the Figures, in which:

FIG. 1A shows an epitaxial crystalline structure;

FIG. 1B shows the epitaxial crystalline structure of FIG. 1A that has been processed to form mesas;

FIG. 1C shows the structure of FIG. 1B that has been processed further;

FIG. 1D shows the structure of FIG. 1C that has been processed further;

Figures 1A, 1B, 1C, 1D:
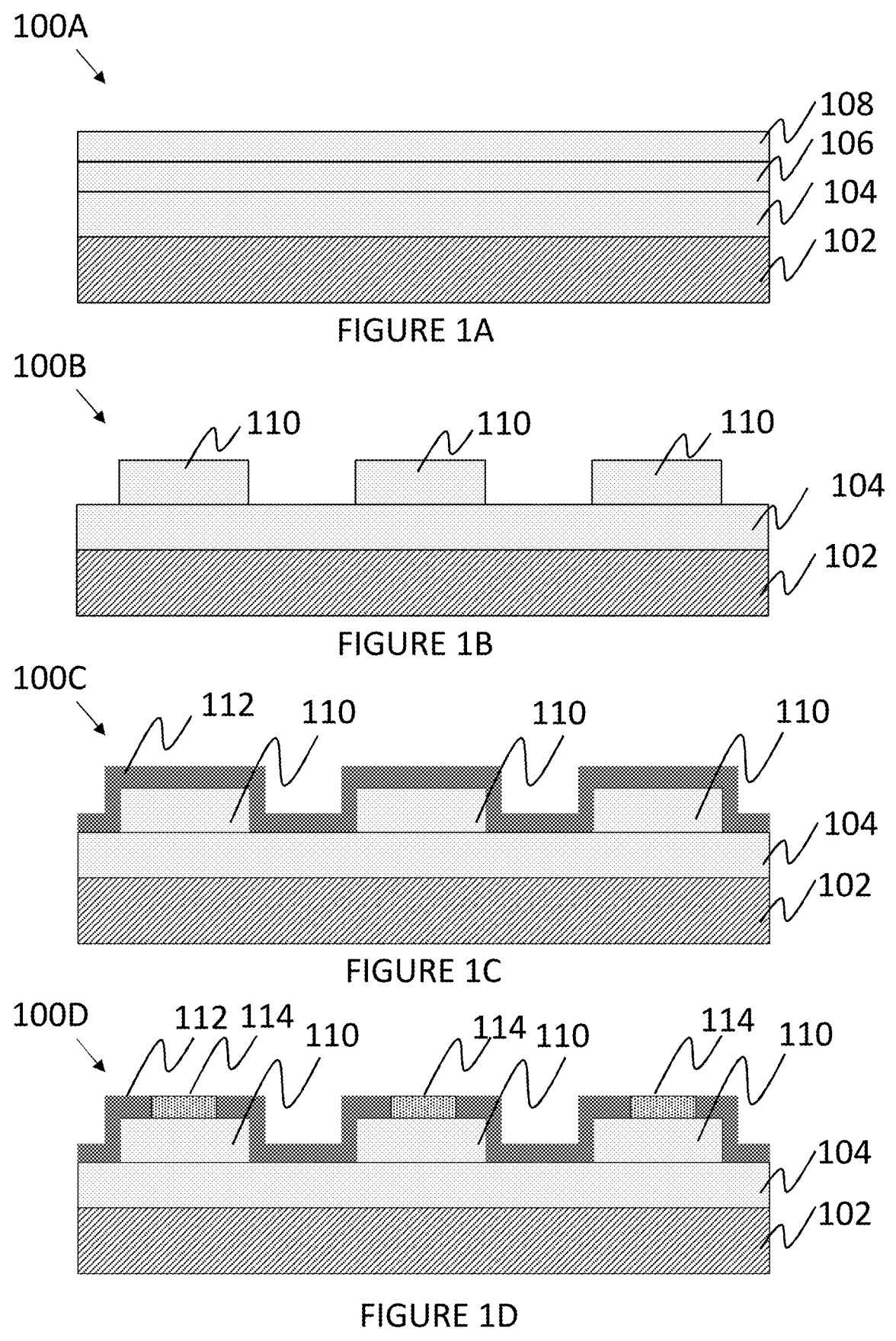
Figures 1E, 2, 3A, 3B:
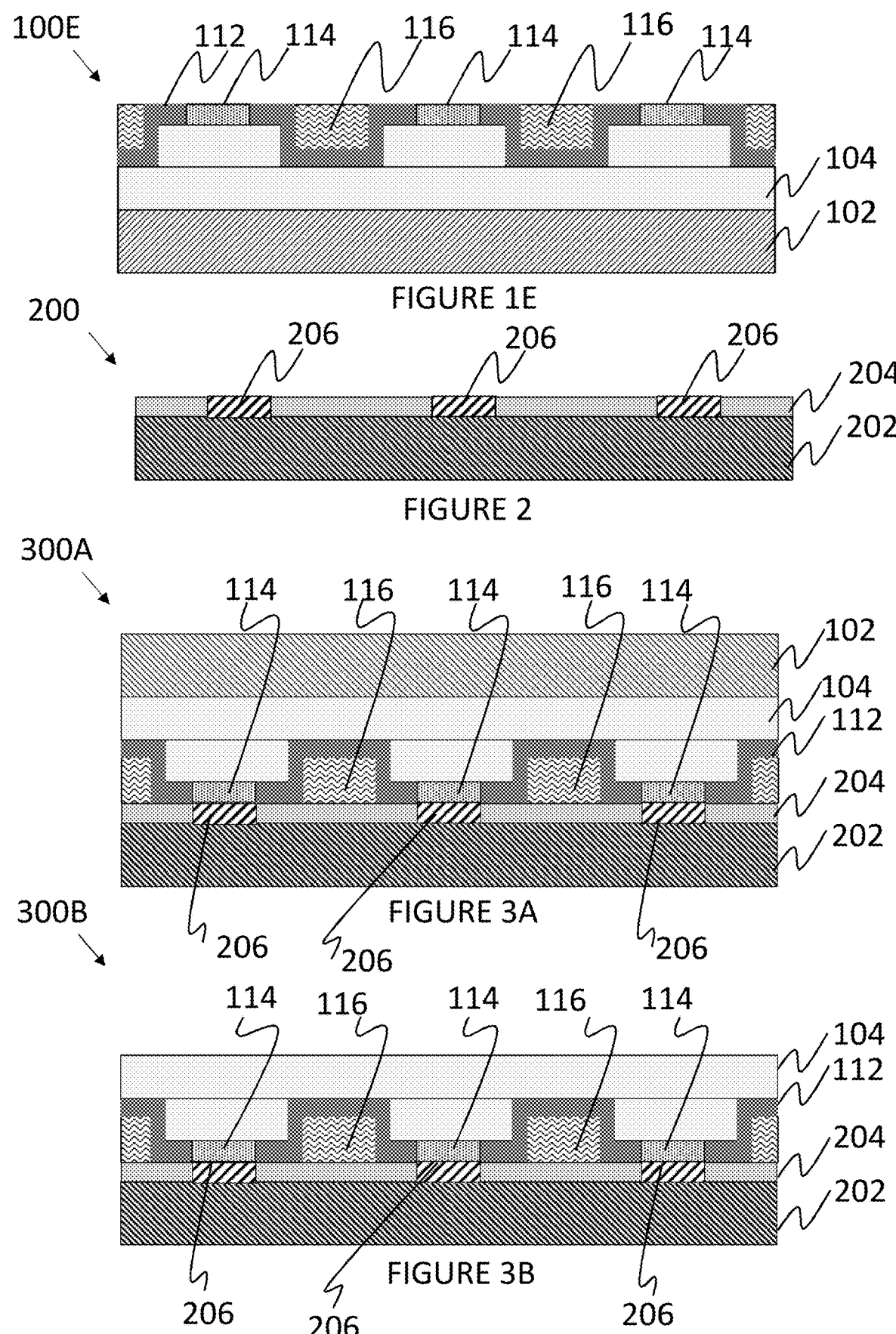
FIG. 1E shows the structure of FIG. 1D that has been processed further.
FIG. 2 shows a processed backplane.
FIG. 3A shows the structure of FIG. 1E bonded to the backplane of FIG. 2.
FIG. 3B shows the structure of FIG. 3A that has been processed further.

As described above, whilst monolithically grown LED devices beneficially enable the production of micro LED displays of ultra-fine pitch for high resolution display applications, there are difficulties associated with defective LED dies in the display arrays. The following process and structure described with reference to FIGS. 1 to 5 enables a repair and replacement process for monolithic micro LED displays that achieves the necessary yield requirements whilst avoiding the need to transfer very high numbers of pixels by mass transfer pick and place based methods, for example. The method and structure enables display arrays of pixels to be provided, where the e.g., where the light emitting surface area of each pixel is less than or equal to 100 $\mu m^2$, and preferably less than or equal to 16 $\mu m^2$, and where the pixel pitch is less than 10 $\mu m$ and preferably less than 4 $\mu m$ and more preferably less than 3 $\mu m$.

Advantageously, whilst the method and structure described here is used to replace defective dies, in further examples it is used to provide LED dies in the array that are configured to emit light of a different wavelength to the dies formed in the monolithically grown array of LED devices. For example, it is known to provide highly efficient LED devices based on nitride materials configured to emit light with a primary peak wavelength that is blue or green, but the provision of red light using such materials is more challenging. Gallium arsenide (GaAs) based materials, for example, are a more established technology for red-light emitting LED dies. Therefore, in an example, the method described herein is used to replace LED dies in monolithically grown arrays of nitride-based LED dies to provide light of different wavelengths. Advantageously, the number of dies that would be transferred into the monolithically grown array is much less than the total number of dies in the array, providing a more efficient and practical method for forming high resolution multi-colour micro LED arrays.

FIG. 1A a cross sectional view of an epitaxial crystalline structure 100A. The epitaxial crystalline structure 100A is a structure formed from crystalline layers sequentially grown or deposited to provide a light emitting structure. The epitaxial crystalline structure 100A is provided using metal organic chemical vapour deposition (MOCVD). In further examples, alternative and/or additional methods of growth and/or deposition are used to provide the epitaxial crystalline structure 100A, for example molecular beam epitaxy (MBE). Advantageously, the epitaxial crystalline structure 100A is provided in a continuous growth process and has a high crystalline quality and low defect density. In further examples, the epitaxial structure 100A is provided using multiple growth steps that enable the selective provision of particular qualities, for example different wavelengths of light emission upon radiative recombination of carriers from different areas of the epitaxial crystalline structure 100A.

At FIG. 1A there is shown a growth substrate 102, upon which there is grown an n-type region 104. The growth substrate 102 is a silicon substrate. Alternatively, in further examples different material is used in order to provide a growth substrate 102. The n-type region 104 is formed from n-type doped gallium nitride (GaN). In further examples, the n-type region 104 is formed from additional and/or alternative layers. For example, further buffer layers are included. On top of the n-type region 104 there is shown an active region 106. The active region 106 is configured to emit light following the recombination of carriers injected from n-type and p-type regions. The active region 106 includes a multiple quantum well (MQW) structure. In further examples, the active region includes a single quantum well (SQW) structure. The active region 106 is configured to emit light with a primary peak wavelength that is controlled. In further examples, different portions of the active region 106 are configured to emit light with different primary peak wavelengths.

On top of the active region 106 there is shown a p-type region 108. The p-type region 108 is formed from p-type doped GaN. In further examples, the p-type region 108 is formed from additional and/or alternative layers.

The epitaxial crystalline structure 100A is based on group III-V material (such as III-nitride material, e.g. GaN based materials). Whilst the structure is shown to be a nitride based structure, in further example different materials are used to provide a monolithic array of light emitting devices. Whilst the n-type region 104, active region 106 and p-type region 108 are shown, the skilled person understands in further examples further layers and/or alternative layers are used in order to provide the epitaxial crystalline structure 100A. Once the epitaxial crystalline structure 100A has been provided, as shown at FIG. 1A, the epitaxial crystalline structure is processed in order to form multiple monolithically grown LED devices. This is shown at FIG. 1B. FIG. 1B shows a cross sectional view of a processed structure 100B based on the epitaxial crystalline structure 100A of FIG. 1A, where mesas 110 have been formed.

The mesas 110 each include portions of the p-type region 108 and the active region 106. The mesas 110 are shown to have been formed on the n-type region 104. The mesas 110 are formed by selectively patterning and etching the epitaxial crystalline structure 100A using known techniques. The skilled person understands that alternatively and/or additionally the mesas 110 are formed from different and/or additional layers.

Once the mesas 110 have been formed as shown at FIG. 1B, the process moves to FIG. 1C, where a conformal layer 112 is deposited on the mesas 110. FIG. 1C shows a cross sectional view of a processed structure 100C that is a processed version of the structure 100B of FIG. 1B. There is shown a conformal layer 112 formed on the mesas 110. The conformal layer 112 is deposited using known deposition techniques and is formed such that irreversible bonding with other layers is avoided at a later stage. The conformal layer 112 is dielectric layer formed from silicon dioxide (SiO$_2$). Alternatively and/or additionally in further examples, the conformal layer is a dielectric layer formed from a different material such as silicon nitride (Si$_3$N$_4$), photoresist such as Su-8, strontium fluoride (SrF$_2$), polydimethylsiloxane (PDMS) or poly(methyl methacrylate) (PMMA). In further examples, the, or any other suitable material that enables reversible bonding at contacts without bonding by the portion of the conformal layer 112 that contacts a backplane to which the eventual structure is bonded.

The conformal layer 112 is further processed in order to provide contacts to the p-type region 108. This is shown at FIG. 1D. FIG. 1D shows a cross sectional view of a processed epitaxial structure 100D that is a processed version of the structure 100C described with respect to FIG. 1C. The structure 100C of FIG. 1C is processed in order selectively to pattern and etch windows through the conformal layer 112, thereby to expose at least a portion of each of the mesas 110 to which p-type contacts with the p-type region 108 are to be formed. Once the windows have been provided, p-type contacts are 114 are formed in the windows on the mesas 110.

The electrical p-type contacts 114 are formed from a metal. In an example, the metal is relatively highly reflective. Advantageously, the use of a relatively highly reflective electrical p-type contact 114 aids light extraction from the individual LED dies that are formed based on the mesas 110 of the monolithically grown structural 100. The electrical p-type contacts 114 are formed in order to enable metal bonding (such as gold to gold (Au—Au) or copper to copper (Cu—Cu) bonding) and eutectic bonding (gold-tin (Au—Sn), copper-tin (Cu—Sn), indium-tin (InSn)) with a backplane. Alternatively and/or additionally, in further examples, the electrical p-type contacts 114 are formed from any suitability reflective and conductive material that can be used to form a reversible bond. In an example, the electrical p-type contacts 114 are formed from nickel and/or silver. The electrical p-type contacts 114 are used to form reversible bonds with a further backplane device and are therefore formed from a material that facilitates such reversible bonding. This is described in more detail below.

Once the electrical p-type contacts 114 have been formed on the mesas 110 as shown at FIG. 1D, the process moves to that shown at FIG. 1E. At FIG. 1E there is shown a cross sectional view of a structure 100E that is the epitaxial structure 100D of FIG. 1D that has been processed further in order to planarise the structure.

Accordingly, in FIG. 1E there is shown material 116 deposited into the gaps formed between the mesas 110, the surface of which has been planarised. Such planarization is achieved by deposition and chemical mechanical polishing of the material 116 to form a planar surface suitable for bonding to a further device. In further examples, alternative and/or additional methods are used in order to planarise the surface opposite the growth substrate 102. The material 116 is a metal. Further examples, alternative and/or additional material 116 is used, such as dielectric material. Once the structure 100E has been provided, it is bonded to a backplane structure, as described below with reference to FIGS. 2 and 3.

FIG. 2 illustrates a processed backplane 200 that has been processed in order to reversibly bond to a monolithically grown LED array, such as that described above with respect to FIG. 1.

FIG. 2 shows a CMOS backplane 202 upon which a dielectric layer 204 has been deposited. The dielectric layer 204 is processed in order to pattern and selectively etch windows in which material is deposited to form electrical backplane contacts 206 using known techniques. The formation of windows exposes portions of the CMOS backplane 202 to which p-type contacts can be connected in order to control light emission from individual LED devices of in an array of LED devices. Whilst the backplane 202 is a CMOS backplane 202, in further examples, additional and/or alternative backplanes are used to bond with an LED based structure to form a functioning display.

The backplane contacts 206 are designed to form a reversible bond with the electrical p-type contacts 114 of the structure 100E shown at FIG. 1E. Accordingly, the backplane contacts 206 are formed in order to enable metal bonding (such as gold to gold (Au—Au) or copper to copper (Cu—Cu) bonding) and eutectic bonding (such as gold-tin (Au—Sn), copper-tin (Cu—Sn), indium-tin (InSn)). Accordingly, the combination of material used to form the p-type contacts 114 of the structure 100E shown at FIG. 1E and the electrical backplane contacts 206 is chosen to provide a combination of material that provides a reversible bond.

The dielectric layer 204 is formed from silicon dioxide. Alternatively, and/or additionally the dielectric layer 204 is formed from silicon nitride, Su-8, $SrF_2$, PDMS, PMMA or any other suitable material. The dielectric layer 204 is formed such that it contacts with the conformal layer 112 and accordingly the aim is to prevent an oxide-oxide combination during bonding, such that the dielectric layer 204 does not form an irreversible bond with the conformal layer 112. Accordingly, the combination of material used to form the conformal layer 112 and the dielectric layer 204 is chosen to provide a combination of material that provides a reversible bond at the electrical contacts and not at other portions of the interface between the processed backplane 200 and the monolithically grown epitaxial structure 100E.

Once the processed backplane 200 and the structure 100E have been provided, they are bonded together. This is shown at FIG. 3A.

The structure 300A of FIG. 3A shows a cross sectional view of the structure 100E of FIG. 1E bonded to the processed structure 200 of FIG. 2. The structure 100E and the processed structure 200 are bonded using thermocompression bonding techniques. In further examples, additional and/or alternative techniques are used to bond the structures 100E, 200. Accordingly, the electrical p-type contacts 114 are aligned with the backplane contacts 206 of the processed backplane 200. Whilst the combined structure 300A is shown in cross-section, the skilled person understands that the process is used for two dimensional arrays of LED devices that are monolithically grown on growth substrate 102 and bonded to a planar surface of a processed backplane 200. The electrical p-type contacts 114 of the monolithically grown LED array are arranged in order to coincide with backplane contacts 206 of the backplane 200 thereby to form reversible bonds between the p-type contacts 114 of the monolithically grown LED array and the backplane contacts 206 of the backplane 200.

Once the backplane 200 has been bonded to the structure 100E in order to provide the structure 300A of FIG. 3A, the growth substrate 102 of the epitaxial crystalline structure 100A is removed. This is shown at FIG. 3B. FIG. 3B shows a structure 300B which is the structure 300A of FIG. 3A that has been processed in order to remove the growth substrate 102. Once the growth substrate 102 has been removed, the n-type region 104 is exposed and can be selectively patterned and etched using known techniques. This is shown at FIG. 3C.

Figures 3C, 3D, 4A:
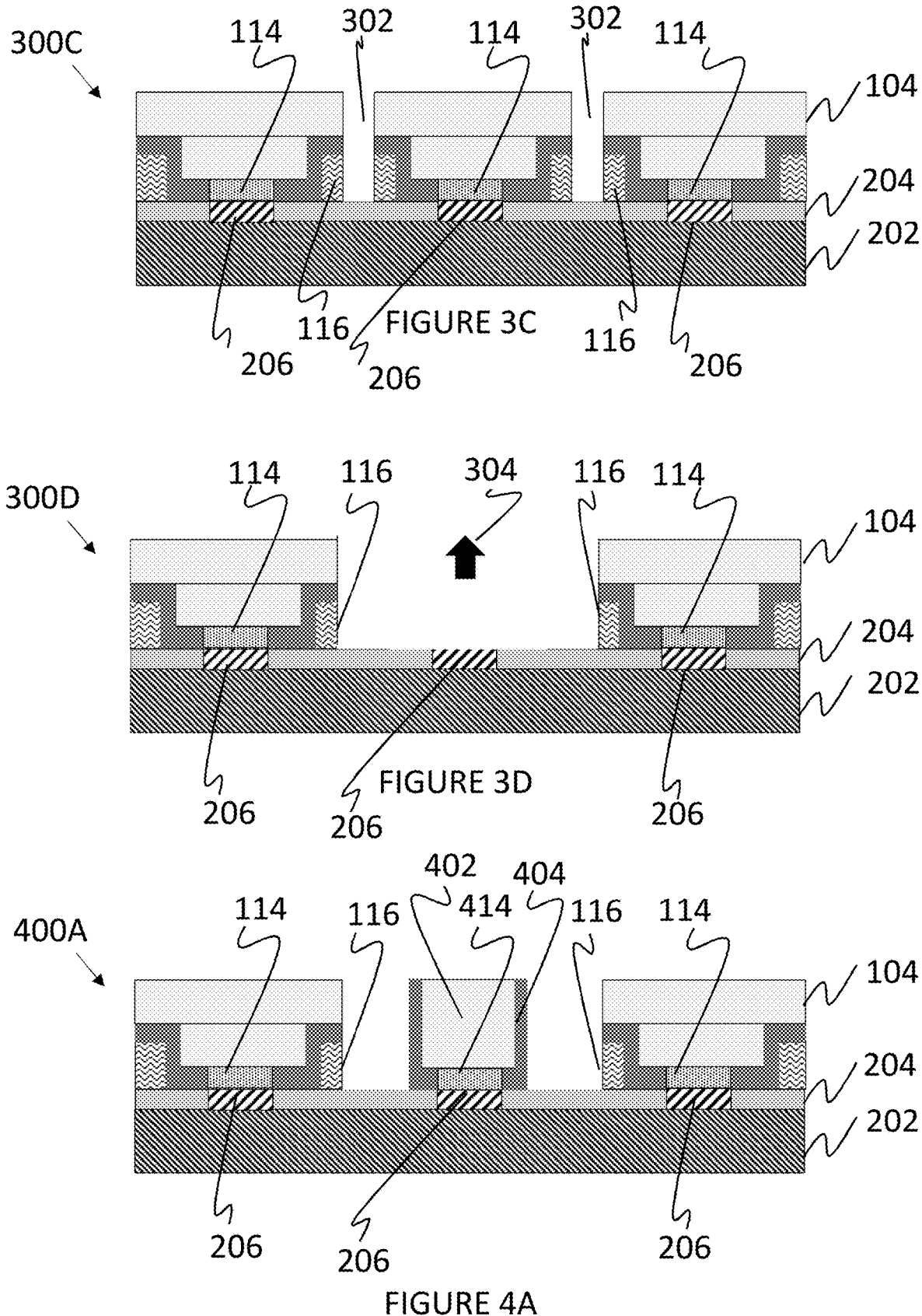
FIG. 3C shows the structure of FIG. 3B that has been processed further.
FIG. 3D shows the structure of FIG. 3C that has been processed further to remove an LED die.
FIG. 4A shows the structure of FIG. 3D with a replacement LED die.

FIG. 3C shows a cross sectional view of a structure 300C that is the structure 300B of FIG. 3B that has been processed further in order selectively to etch through the n-type region 104, the conformal layer 112 and the planarising material 116 in order to expose at least a portion of the dielectric layer 204 associated with the backplane 200 through etched channels 302. Beneficially, such etching physically isolates LED dies (and therefore associated pixels) linked to individual mesas 110 formed as described above with respect to FIG. 1B. Such physical isolation of LED dies results in a discontinuous n-type region 104 as the etched channels 302 surround individual LED dies in order to physically isolate them. Advantageously, monolithically grown arrays of LED devices formed and enable high resolution arrays of pixels to be provided, whilst further enabling individual isolation of LED dies.

The physical isolation of individual LED dies that are each associated with a pixel means that individual pixels (or LED dies) are bonded to the backplane 202 via a bond between the backplane contacts 206 of the backplane and the electrical p-type contacts 114 of the LED dies. There is no significant bonding between the dielectric layer 204 and conformal layer 112, or the planarising material 116 and the dielectric layer 204. The bonds between the backplane contacts 206 of the backplane 200 and the electrical p-type contacts 114 of the LED dies are reversible bonds, that is to say they can be broken in order to remove dies and reformed in order to bond replacement dies at the same site. Such reversible bonds are metal-metal bonds formed by thermocompression bonding, or eutectic bonds. In further examples, alternative and/or additional reversible bonds are formed using other suitable materials to provide reversible, conductive bonds between the backplane 200 and the LED dies.

Once the individual dies have been isolated, they can then be tested in order to identify any defective dies. Once defective dies are identified, they can be removed by breaking the reversible bond between the particular backplane contact 206 of the backplane and the associated p-type contact 114 of the associated defective die/pixel. Such dies, once identified can be removed. This is shown at FIG. 3D.

At FIG. 3D there is shown a cross sectional view of the structure 300C of FIG. 3C that has been processed further in order to provide the structure 300D, whereby the central LED of the FIG. 3C has been removed 304. Such removal is facilitated by heating the area associated with the backplane contact 206 of the backplane 200 and the electrical p-type contact 114 to above a temperature threshold to enable separate of the LED die from the backplane 200. Such a temperature threshold to enable separation of the LED die from the backplane 200 is the eutectic temperature of the eutectic bond. In further examples, the temperature threshold is based on a different measure, such a melting point of the metal, or other suitable temperate. Once the force bonding the backplane contact 206 of the backplane 200 and the electrical p-type contact 114 of the LED device is small enough, the defective die is removed through suction processes. In further examples, additional and/or alternative techniques are used to remove selected LED dies. Additionally, in further examples, plasma treatment is used to remove any residual material left on the surface from the removal process. Once defective dies have been removed, replacement dies can be deposited. This is shown at FIG. 4A.

FIG. 4A shows a cross sectional view of a structure 400A that is the structure 300D of FIG. 3D that has been processed further in order to provide a replacement LED die 402. The replacement LED die 402 (which includes an n-type region, p-type region, active region and p-type contact 414) is contacted with the backplane 202 via the backplane contact 206 of the backplane 200 and the p-type contact 414 of the replacement die LED 402 forming a eutectic bond between the backplane contact 206 and the p-type contact 414. The LED die 402 has a conformal layer 404 formed on it in an analogous manner to that of the conformal layer 112 of the monolithically grown structure described with respect to FIGS. 1 to 3. Whilst the bond is a eutectic bond, in further examples, alternative and/or additional bonding methods are used to secure the LED die 402 in the structure 400A.

Whilst the process shown in respect to FIG. 3D and 4A illustrates the replacement of defective dies. Additionally and/or alternatively, in further examples LED dies may be removed in order to replace dies with different devices. For example, in order to insert red light emitting devices (such AlInGaP based red light emitting LED devices) into such monolithically grown arrays of light emitting devices with high quality blue and/or green light emitting LED device, where the method for forming high efficiency red light emitting LEDs differs from that used to form high efficiency blue and/or green light emitting LED devices. Advantageously, the number of replacement LED devices that are inserted to provide multi colour light emitting arrays is significantly lower than forming arrays of multi colour light emitting LED devices by pick and place technologies.

Figure 4B:
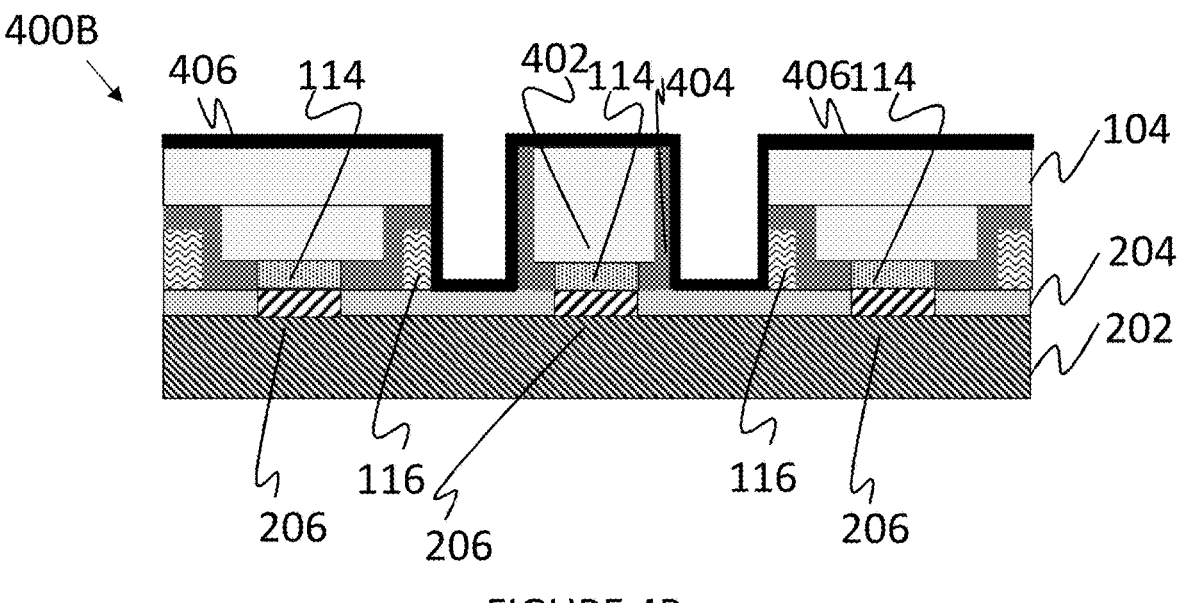
FIG. 4B shows the structure of FIG. 4A that has been processed further.

Once the replacement of a defective/unrequired die has been replaced as shown at FIG. 4A the process moves to FIG. 4B. At FIG. 4B there is shown a cross sectional view of a structure 400A of FIG. 4A that has been processed to provide the structure 400B of FIG. 4B. The structure 400B includes a metallic conformal layer 406 that has been deposited on the structure 400A. This conformal layer 406 acts to reduce optical crosstalk between pixels associated with light emitting device dies in the display array. Once the metallic conformal layer 406 has been deposited at FIG. 4B, the process moves to FIG. 4C.

Figure 4C:
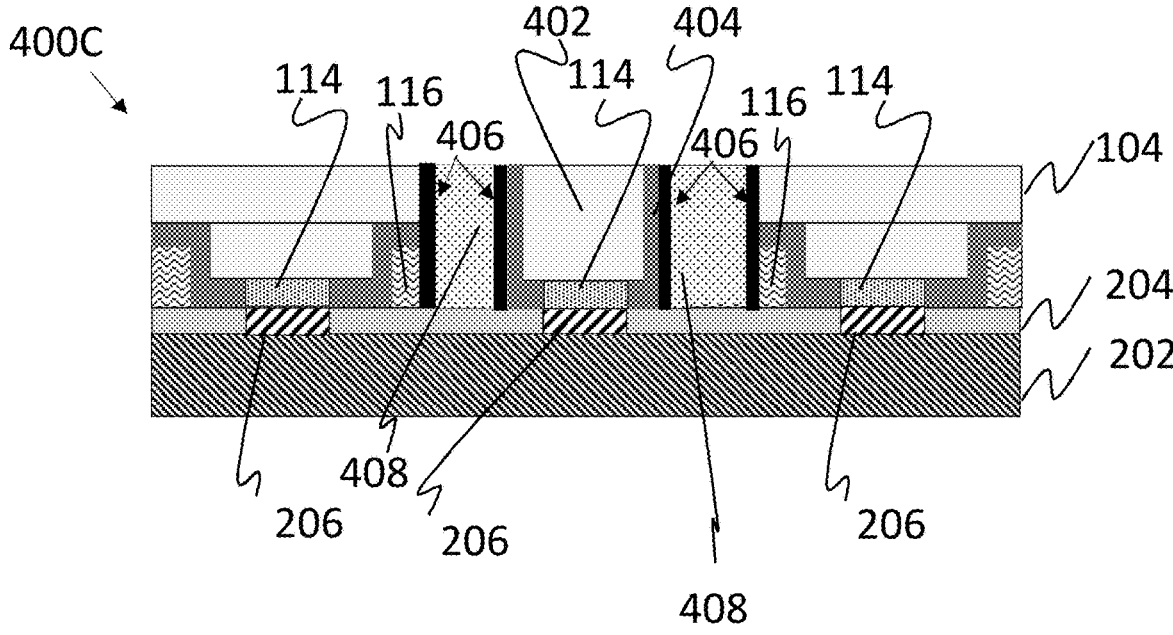
FIG. 4C shows the structure of FIG. 4B that has been processed further.

At FIG. 4C there is shown a cross sectional view of a structure 400C that is the structure 400D of FIG. 4B that has been processed further in order to anisotopically etch the metallic conformal layer 406. Such anisotropic etching results in metal being left on the side walls of the light emitting dies. Once this anisotropic etch has been performed, filler material 408 is formed in the gaps between the LED devices. Such filler material 408 is deposited using known techniques and planarised using chemical mechanical polishing techniques. In further examples, alternative and/or additional methods are used in order to planarise the n-type side of the device of the structure 400C. Once the structure 400C has been planarised, the process moves to provide the structure shown at FIG. 4D.

Figure 4D:
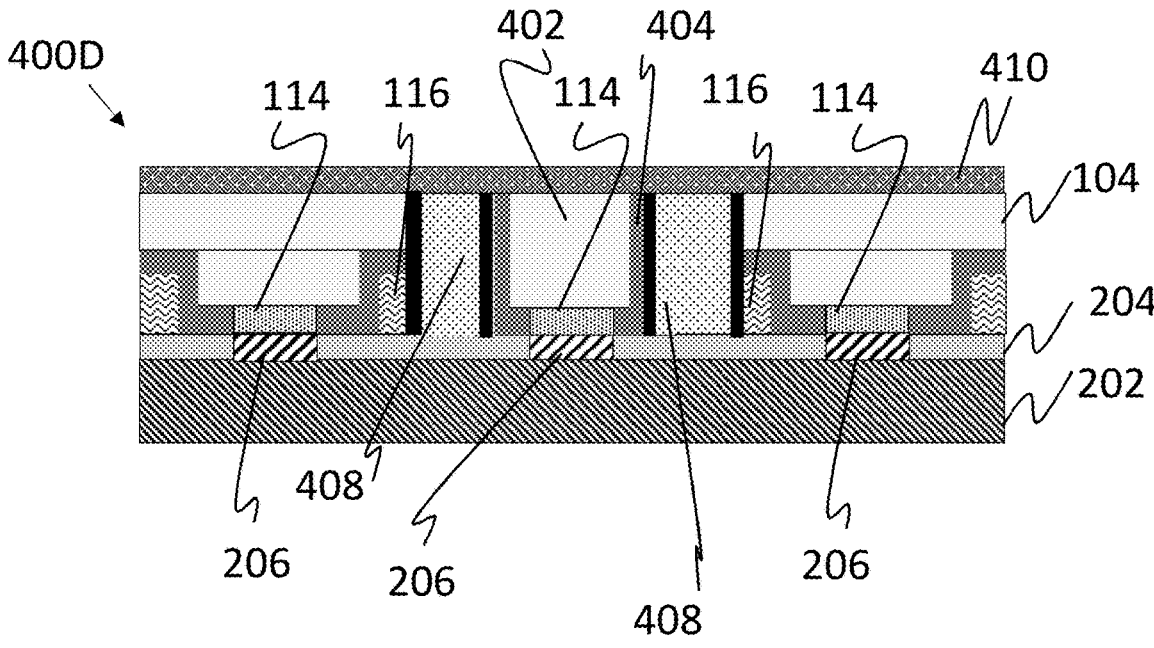
FIG. 4D shows the structure of FIG. 4C that has been processed further.

FIG. 4D shows a cross sectional view of a structure 400D that is the structure for 400C of FIG. 4C that has been processed in order in order to deposit a transparent conducting material layer 410. Such a layer is formed from indium tin oxide (ITO). Alternatively, and/or additionally, further examples different conducting transparent material is used. The transparent conducting material layer 410 enables formation of n-type contact with the n-type region 104 of multiple now isolated dies. Alternative and/or additional layers are used in further examples, for example metal tracks are used to assist with current spreading.

Accordingly, a method is described to provide repaired and/or replacement dies in a monolithically grown array of dies, where multiple dies provides a source of light at the light emitting surface associated with a pixel driven by the CMOS backplane 202.

Figure 5:
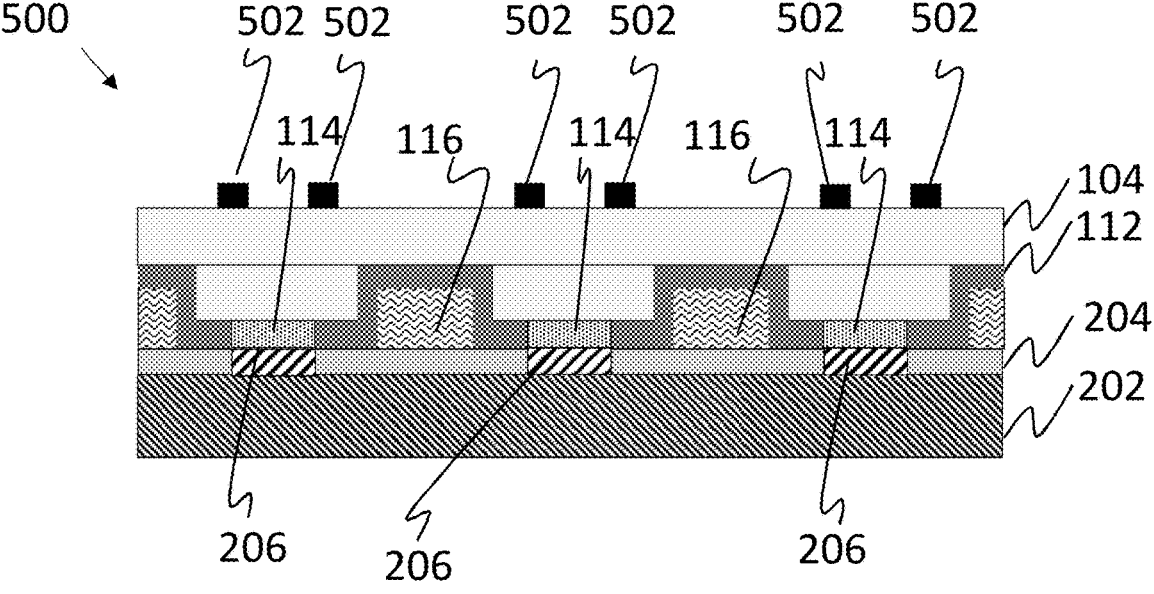
FIG. 5 shows the structure of FIG. 3B that has been processed further.

The skilled person understands that different and/or additional layers may be implemented throughout in order to provide advantageous functionality. For example FIG. 5 illustrates how lift-off of selected dies is enhanced. FIG. 5 shows the structure 500 that is the structure of FIG. 3B with additional magnetic material 502 formed in association with individual dies. Such magnetic material 502, (for example iron, nickel, cobalt) is deposited on part of the individual LED devices associated with pixels. In further examples, alternative and/or additional configurations are used in order to provide magnetic functionality associated with individual dies. The magnetic material 502 is used in order to facilitate lift-off following isolation of pixels. Once repair and/or replacement of defective and/or unrequired dies has been performed, the magnetic material 502 is etched away, enabling the further deposition of transparent conducting material 410 as described with respect to FIG. 4D.

Advantageously, the methods described here enable repair in monolithic micro displays, allowing necessary yield requirements to be achieved. Further, the method enables different colour light emitting LED devices to be deposited on a monolithic display, such as red LED dies into blue/green monolithic displays.

Whilst the processes described above are shown in a particular order, in further examples, alternative and/or additional steps are provided in order to enable the removal and replacement of LED dies in an array of LED devices that are monolithically grown.

Whilst the epitaxial structures described herein are described with reference to n-type growth on a growth substrate prior to the formation of an active region and p-type region, with p-type contacts subsequently being formed on the top of mesas for connection with a backplane, the skilled person understands that the techniques, in further examples, are applicable to differently formed structures, for example based on a reversed growth sequence and/or with additional or alternative layers and/or with n-type contacts formed on mesas to form reversible bonds at corresponding contacts of a backplane.

The invention claimed is:

1. A method of forming a display comprising:
   planarizing a backplane comprising a plurality of backplane electrical contacts to provide a first planarized surface;
   planarizing a monolithic light emitting diode structure comprising a plurality of electrical contacts corresponding to the plurality of electrical contacts of the backplane to provide a second planarized surface;
   bonding the first planarized surface to the second planarized surface, wherein bonding comprises forming a reversible bond between at least one of the plurality of backplane electrical contacts and a corresponding electrical contact of the monolithic light emitting diode structure; and
   subsequently selectively etching the monolithic light emitting diode structure to provide a plurality of physically isolated light emitting diode dies, thereby to enable removal and/or replacement of at least one physically isolated light emitting diode die by reversing the reversible bond between the at least one of the plurality of backplane electrical contacts and the corresponding electrical contact of the monolithic light emitting diode structure.

2. The method according to claim 1, wherein the at least one of the backplane electrical contacts is reversibly bonded to the corresponding electrical contact of the monolithic light emitting diode structure using metal-to-metal bonding and/or eutectic bonding.

3. The method according to claim 1 comprising:
removing at least one physically isolated light emitting diode die; and
replacing the at least one physically isolated light emitting diode die with a different one or more light emitting diode dies.

4. The method according to claim 3, wherein removing at least one physically isolated light emitting diode die comprises increasing a temperature of the display thereby to enable removal of the at least one physically isolated light emitting diode die at the reversible bond between the backplane electrical contact and the corresponding electrical contact associated with the monolithic light emitting diode structure, preferably wherein increasing the temperature of the display comprises increasing the temperature at the reversible bond to surpass a eutectic temperature of the reversible bond, preferably wherein the reversible bond comprises at least one of a AuSn eutectic bond, a CuSn eutectic bond and a InSn eutectic bond.

5. The method according to claim 3, wherein removing at least one physically isolated light emitting diode die comprises overcoming an electrostatic force of the reversible bond, preferably wherein the electrostatic force of the reversible bond is the electrostatic force of at least one of a Au—Au metal bond and a Cu—Cu metal bond.

6. The method of claim 1 comprising:
testing at least one of the plurality of physically isolated light emitting diode dies;
identifying one or more defective light emitting diode dies;
removing defective light emitting diode dies; and
replacing the one or more removed defective light emitting diode dies.

7. The method according to claim 1, comprising:
forming a conformal metal layer on at least a portion of the physically isolated light emitting diode dies, thereby to reduce optical cross talk between physically isolated light emitting diode dies.

8. The method according to claim 1 comprising:
forming a transparent electrically conductive layer on the plurality of isolated light emitting diode dies, thereby to provide a common electrode.

9. The method according to claim 1 comprising:
forming one or more magnetic metal regions associated with at least one of the physically isolated light emitting diode dies, thereby to facilitate removal of physically isolated light emitting diode dies.

10. The method according to claim 1, wherein at least one of the reversible bonds is at least partially laterally surrounded by a dielectric layer thereby to separate the backplane and the monolithic light emitting diode structure, preferably wherein the dielectric layer comprises at least one of $SiO_2$, $Si_3N_4$, Su-8, $SrF_2$, PDMS and PMMA.

11. The method according to claim 1, wherein the plurality of electrical contacts of the monolithic light emitting structure comprises a high reflectivity metal, preferably wherein the high reflectivity metal is one of Ni and Ag.

12. The method according to claim 1, wherein removing material from the monolithic light emitting diode structure comprises forming a discontinuity in at least one layer of the monolithic light emitting diode structure, preferably wherein the at least one layer of the monolithic light emitting diode structure is an n-type layer, more preferably wherein the n-type layer is an n-doped gallium nitride layer.

13. A method of forming a display comprising:
planarizing a backplane comprising a plurality of backplane electrical contacts to provide a first planarized surface;
planarizing a monolithic light emitting diode structure comprising a plurality of electrical contacts corresponding to the plurality of backplane electrical contacts of the backplane to provide a second planarized surface;
bonding the first planarized surface to the second planarized surface, wherein bonding comprises forming a reversible bond between at least one of the plurality of backplane electrical contacts and a corresponding electrical contact of the monolithic light emitting diode structure; and
subsequently selectively etching the monolithic light emitting diode structure to provide a plurality of physically isolated light emitting diode dies, thereby to enable removal and/or replacement of at least one physically isolated light emitting diode die by reversing the reversible bond between the at least one of the plurality of backplane electrical contacts and the corresponding electrical contact of the monolithic light emitting diode structure;
wherein the at least one of the plurality of backplane electrical contacts is reversibly bonded to the corresponding electrical contact of the monolithic light emitting diode structure using metal-to-metal bonding and/or eutectic bonding;
wherein at least one of the reversible bonds is at least partially laterally surrounded by a dielectric layer thereby to separate the backplane and the monolithic light emitting diode structure, preferably wherein the dielectric layer comprises at least one of $SiO_2$, $Si_3N_4$, Su-8, $SrF_2$, PDMS and PMMA; and
wherein the plurality of electrical contacts of the monolithic light emitting structure comprises a high reflectivity metal, preferably wherein the high reflectivity metal is one of Ni and Ag.

* * * * *